(12) United States Patent
Wu et al.

(10) Patent No.: US 7,433,194 B2
(45) Date of Patent: Oct. 7, 2008

(54) HEAT SINK FASTENING ASSEMBLY

(75) Inventors: Wei-Le Wu, Shenzhen (CN); Cheng-Tien Lai, Taipei Hsien (TW)

(73) Assignees: Fu Zhun Precision Industry (Shen Zhen) Co., Ltd., Shenzhen, Guangdong Province (CN); Foxconn Technology Co., Ltd., Tu-Cheng, Taipei Hsien (TW)

( * ) Notice: Subject to any disclaimer, the term of this patent is extended or adjusted under 35 U.S.C. 154(b) by 0 days.

(21) Appl. No.: 11/683,355

(22) Filed: Mar. 7, 2007

(65) Prior Publication Data
US 2008/0151507 A1   Jun. 26, 2008

(30) Foreign Application Priority Data
Dec. 22, 2006   (CN) .................. 2006 1 0157888

(51) Int. Cl.
  H05K 7/20   (2006.01)
  A44B 21/00  (2006.01)
(52) U.S. Cl. .............. 361/719; 361/704; 257/718; 257/719; 257/727; 165/80.3; 411/516; 24/458
(58) Field of Classification Search .............. None
See application file for complete search history.

(56) References Cited

U.S. PATENT DOCUMENTS

| | | | | |
|---|---|---|---|---|
| 5,771,960 A | * | 6/1998 | Lin | 165/80.3 |
| 5,933,326 A | * | 8/1999 | Lee et al. | 361/704 |
| 5,953,212 A | * | 9/1999 | Lee | 361/709 |
| 6,111,752 A | * | 8/2000 | Huang et al. | 361/704 |
| 6,118,661 A | * | 9/2000 | Lo | 361/704 |
| 6,229,705 B1 | | 5/2001 | Lee | |
| 6,310,774 B1 | * | 10/2001 | Lee | 361/704 |
| 6,362,963 B1 | * | 3/2002 | Lee et al. | 361/704 |
| 6,418,022 B1 | * | 7/2002 | Chen | 361/704 |
| 6,477,048 B2 | * | 11/2002 | Huang et al. | 361/704 |
| 6,684,476 B1 | * | 2/2004 | Yu | 29/428 |
| 6,754,080 B2 | * | 6/2004 | Lee et al. | 361/710 |
| 6,771,506 B2 | * | 8/2004 | Lee et al. | 361/704 |
| 7,061,764 B2 | * | 6/2006 | Lai et al. | 361/704 |
| 2005/0144764 A1 | | 7/2005 | Lin | |

* cited by examiner

Primary Examiner—Boris L Chervinsky

(57) ABSTRACT

A heat sink fastening assembly includes a fastener comprising a latching member and an operating member. The latching member includes a pressing part, a first latching leg and a second latching leg bent downwards respectively from two opposite ends of the pressing part. The operating member has a coping and a sidewall extending downwards from an edge of the coping. The sidewall defines two locking slots engaging with the first latching leg and an elastic rib extending downwards from the coping and engaged with the first latching leg of the latching member for inhibiting any movement of the operating member in a direction along the locking slot of the sidewall.

17 Claims, 6 Drawing Sheets

HEAT SINK FASTENING ASSEMBLY

BACKGROUND OF THE INVENTION

1. Field of the Invention

The present invention relates to a heat sink fastening assembly, and particularly to a heat sink fastening assembly for securing a heat sink to a heat-generating component to remove heat from the heat-generating component.

2. Description of Related Art

Heat sinks are usually used to remove heat from heat-generating components, such as central processing units (CPUs) and the like, to keep the components at specified temperatures. A typical heat sink comprises a base, for contacting with the heat-generating component to absorb the heat generated by the heat-generating component, and a plurality of fins extending from the base for dissipating the heat into the ambient air.

In order to secure the heat sink to the heat-generating component, a fastener is required. A fastener used for securing a heat sink to a heat-generating component is disclosed in U.S. Patent Application Publication No. 2005/0144764 A1. The fastener comprises a pressing member, an engaging member engaging with the pressing member, and a handle engaging with the engaging member for operating the fastener. The pressing member comprises an elongated elastic bent pressing section and a locking leg extending from an end of the pressing section. The locking leg defines an engaging hole therein for engaging with an engaging jut of a retention module which surrounds the heat-generating component. The pressing section defines a slot in an opposite end thereof. The engaging member at an end thereof has a joining part providing a fitting hole for receiving another engaging jut of the retention module. The engaging member at an opposite end thereof has a piercing part passing through the slot of the pressing section of the pressing member. The handle comprises a cam pivotally connected with the piercing part of the engaging member, and a pressing part extending outwardly from the cam for users to operate the handle relative to the engaging member so that the cam is driven to move on the opposite end of the elastic bent section.

In use of the related fastener to secure the heat sink to the retention module, the pressing section of the pressing member of the fastener spans on the heat sink, and the locking leg of the pressing member is located at a side of the heat sink and engages with a corresponding engaging jut of the retention module. The engaging member is located at an opposite side of the heat sink and corresponding to another corresponding engaging jut of the retention module. The pressing part of the handle of the fastener is pressed down to allow the cam of the handle to rotate on the pressing section of the pressing member of the fastener, and drive the engaging member to move upwardly to engage with the corresponding jut of the retention module. Thereafter, the cam exerts a force on the pressing section such that the pressing section deforms and presses the heat sink toward the retention module; therefore, the heat sink is firmly secured to the heat-generating component. However, it needs large free space for the user to operate the handle during assembling the heat sink to the heat-generating component. Furthermore, the operation of the user to the handle is prone to damage other electronic components located around the heat-generating component. This makes operation of the fastener awkward. Finally, the fastener of the related art has a complicated structure, whereby it has a high cost.

What is needed thereof is a heat sink fastening assembly which has a low cost and can easily secure a heat sink to a heat-generating component whilst operation of the heat sink fastening assembly does not need large free space.

SUMMARY OF THE INVENTION

A heat sink fastening assembly includes a fastener comprising a latching member and an operating member. The latching member includes a pressing part, a first latching leg and a second latching leg bent downwards respectively from two opposite ends of the pressing part. The operating member has a coping and a sidewall extending downwards from an edge of the coping, the sidewall defining two locking slots engaging with the first latching leg, an elastic rib extending downwards from the coping and engaged with the first latching leg of the latching member for inhibiting any movement of the operating member in a direction along the locking slot of the sidewall.

Other advantages and novel features will become more apparent from the following detailed description of preferred embodiments when taken in conjunction with the accompanying drawings.

BRIEF DESCRIPTION OF THE DRAWINGS

Many aspects of the heat sink fastening assembly can be better understood with reference to the following drawings. The components in the drawings are not necessarily drawn to scale, the emphasis instead being placed upon clearly illustrating the principles of the present embodiment. Moreover, in the drawings, like reference numerals designate corresponding parts throughout the several views.

DETAILED DESCRIPTION OF THE INVENTION

Figure 1:
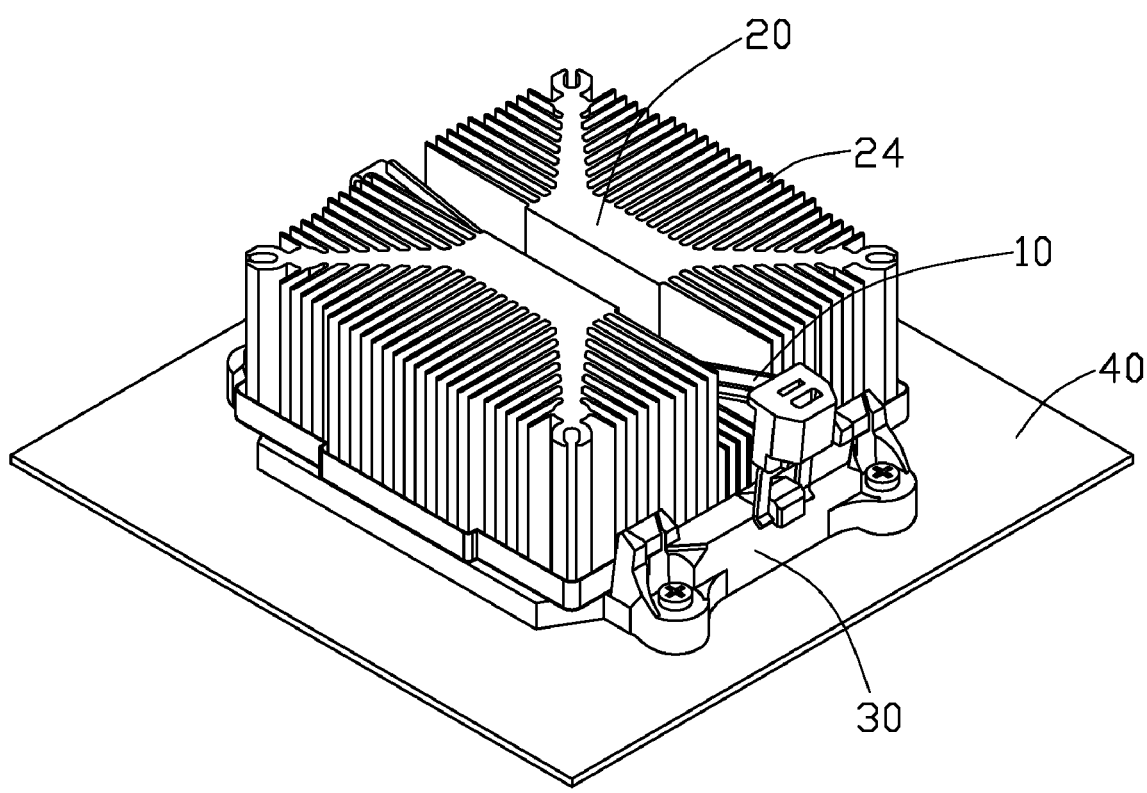
FIG. 1 is an assembled view of a heat sink fastening assembly in accordance with a preferred embodiment of the present invention, together with a heat sink and a heat-generating component mounted on a printed circuit board.
Figure 2:
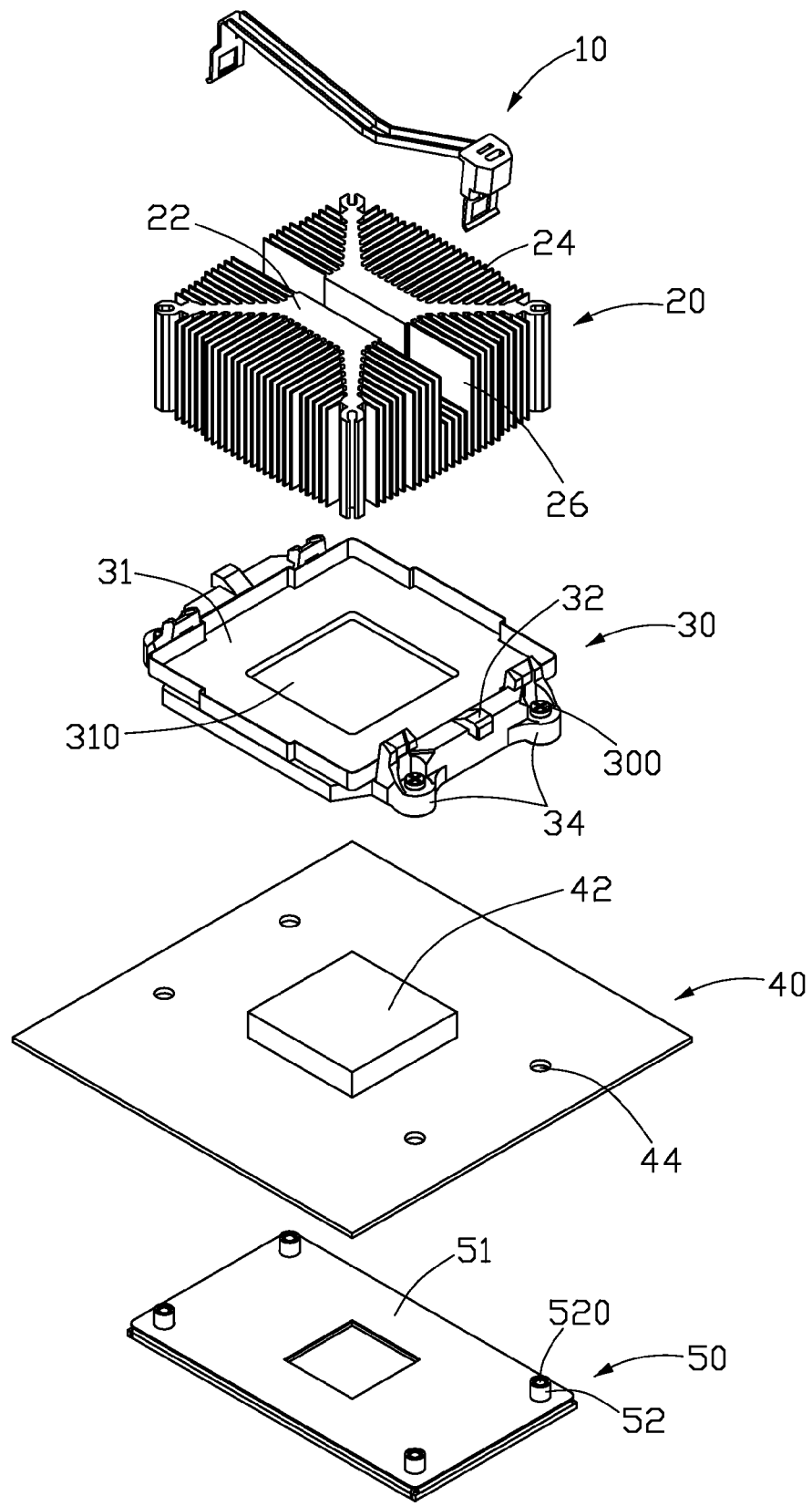
FIG. 2 is an exploded, isometric view of FIG. 1.

Referring to FIGS. 1 and 2, a heat sink fastening assembly in accordance with a preferred embodiment of the invention is used for attaching a heat sink 20 to a printed circuit board 40, for dissipating heat generated by a heat-generating component 42 mounted on the printed circuit board 40. The heat sink fastening assembly includes a fastener 10 for spanning over the heat sink 20 and a retention module 30 for engaging with the fastener 10 to clip the heat sink 20 therebetween. The retention module 30 is mounted on the printed circuit board 40 via a plurality of screws 300 extending through the printed circuit board 40 to engage with a back plate 50 located below the printed circuit board 40.

The back plate 50 comprises a substantially rectangular main body 51 and four posts 52 respectively extending upwardly from four corners of the main body 51. The posts 52 each define a mounting hole 520 for locking the screws 300.

The printed circuit board 40 defines four through holes 44 corresponding to the mounting holes 520 of the back plate 50. The four through holes 44 are located symmetrically around the heat-generating component 42 in the printed circuit board 40 for allowing the screws 300 extending therethrough.

The retention module 30 is substantial a rectangular frame which comprises a supporting plate 31 at a bottom thereof, and four sidewalls (not labeled) extending from four edges of the supporting plate 31, respectively. The supporting plate 31 defines a rectangular opening 310 in centre thereof for allowing a top of the heat-generating component 42 projecting therefrom. Two opposite sidewalls of the retention module 30 each extend an engaging jut 32 outwardly from a center of an upper portion thereof for engaging with the fastener 10, and two protrusions 34 outwardly from a lower portion thereof and adjacent to corners thereof. Each protrusion 34 defines a positioning hole (not shown) for receiving the screw 300.

The heat sink 20 comprises a spreader 22 and a plurality of fins 24 extending radially from the spreader 22. The spreader 22 is a rectangular pillar in shape, and has a flat bottom surface (not labeled) for in contact with a top surface of the heat-generating component 42. A slot 26 is defined through the fins 24 and the spreader 22 for accommodating the fastener 10. The slot 26 spans between the juts 32 of the retention module 30 when the heat sink 20 is located on the retention module 30.

Figure 3:
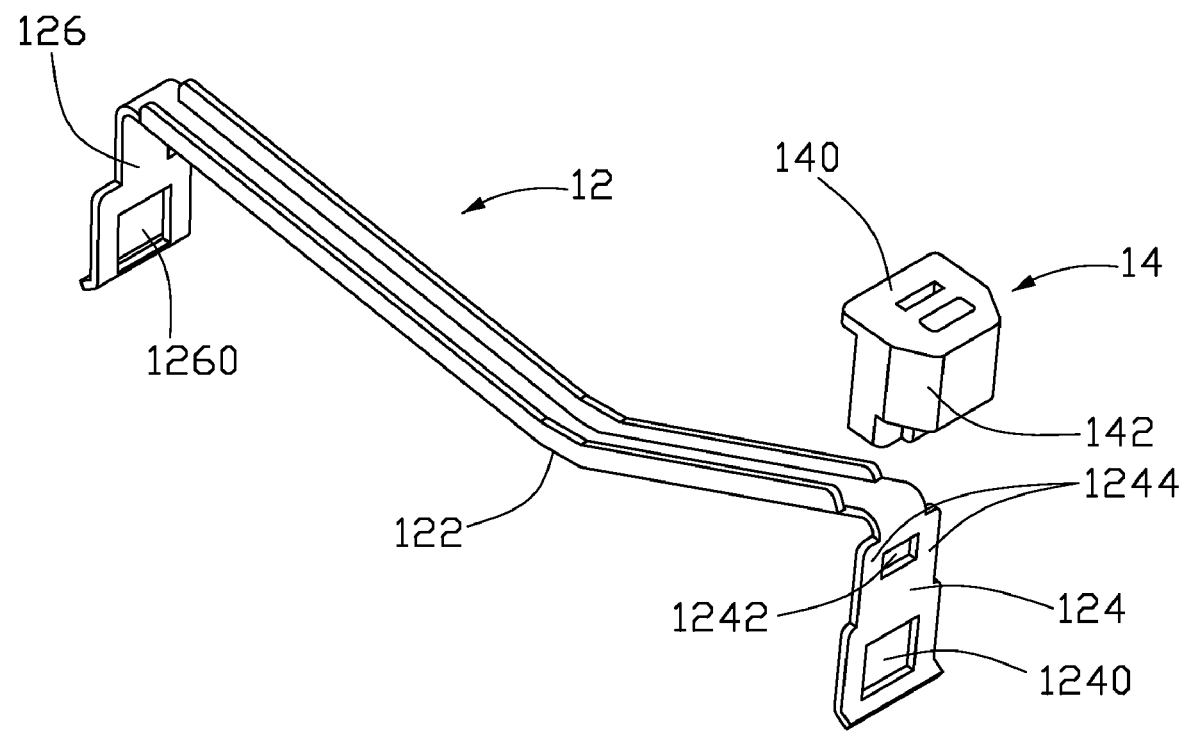
FIG. 3 is an exploded, enlarged view of the fastener of the heat sink fastener assembly in FIG. 2.
Figure 4:
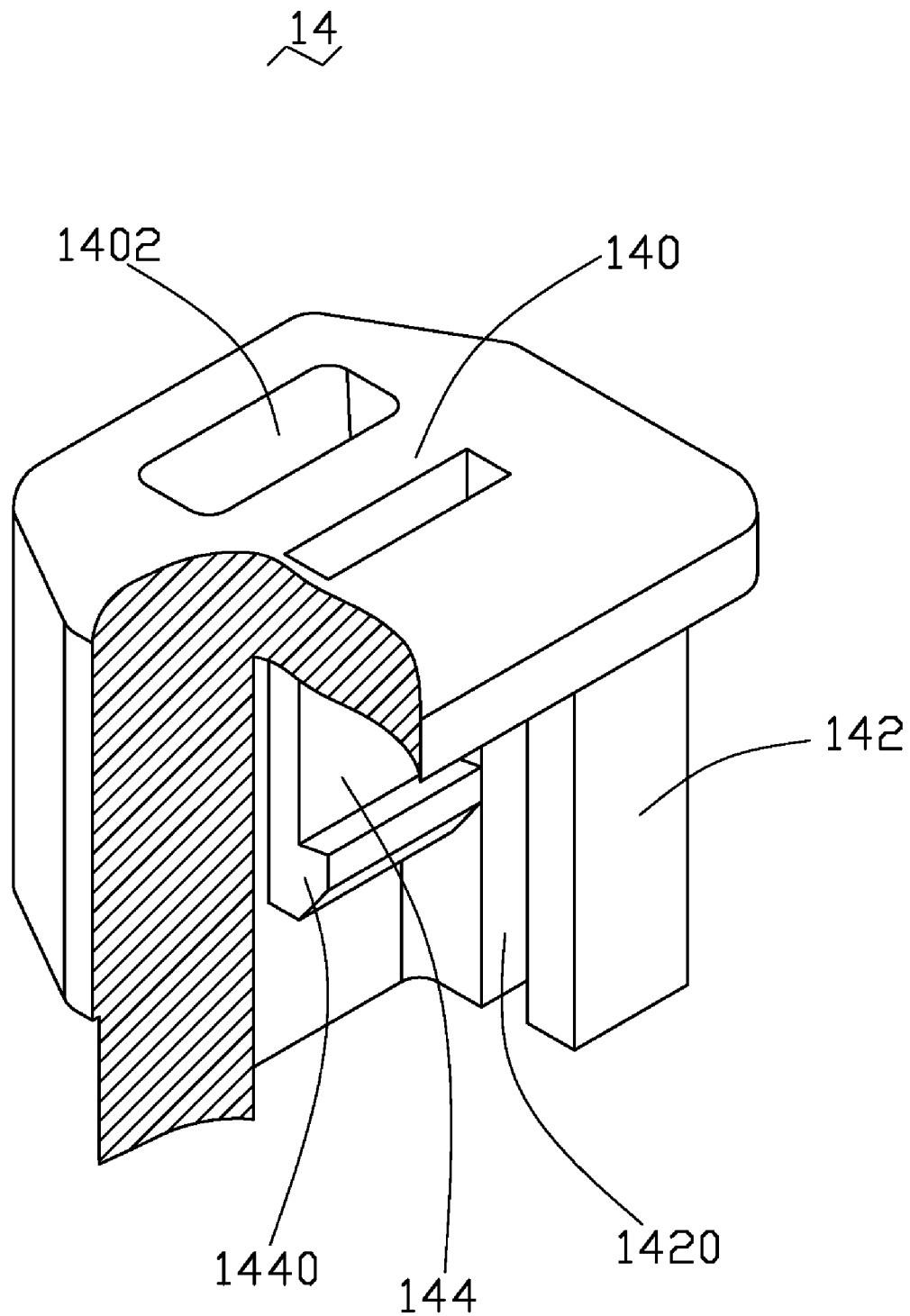
FIG. 4 is a partially cutaway view of an operating member of the fastener in FIG. 3 from a different aspect.

As illustrated in FIGS. 3 and 4, the fastener 10 comprises a latching member 12 and an operating member 14 mounted on an end of the latching member 12.

The latching member 12 is integrally formed from a single piece of stainless steel, and comprises a pressing part 122, a first latching leg 124 and a second latching leg 126 bent downwards respectively from two opposite ends of the pressing part 122. The pressing part 122 is V-shaped and has two flanges (not labeled) bent upwardly from two opposite edges thereof for reinforcing a strength thereof. The pressing part 122 has a bottommost pressing portion (not labeled) thereof adjacent to the first latching leg 124 while remote from the second latching leg 126. The first latching leg 124 defines a first fixing hole 1240 in an expanding lower portion thereof for latching a corresponding jut 32 of the retention module 30, and a locking orifice 1242 above the first fixing hole 1240 in a reducing upper portion. The reducing upper portion of the first latching leg 124 forms two engaging sections 1244 at two opposite sides of the locking orifice 1242, for engaging with the operating member 14. A step (not labeled) is formed between a corresponding engaging section 1244 and an edge of the lower portion of the first latching leg 124. The second latching leg 126 defines a second fixing hole 1260 corresponding to the first fixing hole 1240 of the first latching leg 124 for locking another corresponding jut 32 of the retention module 30.

The operating member 14 is formed from a molded plastic material, and comprises a coping 140 and a sidewall 142 extending downwards from the coping 140. The coping 140 defines two parallel anti-skid recesses 1402 at a top thereof for facilitating positioning of fingers of users. The sidewall 142 integrally extends downwards from two lateral sides and a rear side excepting a front side of the coping 140. The sidewall 142 defines two locking slots 1420 facing each other in an inner side thereof for engaging the two engaging sections 1244 of the first latching leg 124 of the fastener 12. An elastic rib 144 extends downwards from a centre of the coping 140 and is openly surrounded by the sidewall 142. The rib 144 defines a catch 1440 facing the locking slots 1420 of the sidewall 142 at an end thereof, for engagingly received in the locking orifice 1242 of the first latching leg 124 of the fastener 12.

In an assembled state of the fastener 10, the two engaging sections 1244 of the first latching leg 126 of the latching member 12 are engagingly received in the locking slots 1420 of operating member 14. The catch 1440 of the elastic rib 144 of the operating member 14 is securely engaged with the locking orifice 1242 in the first latching leg 124 of the latching member 12 to inhibit any movement along the locking slots 1420 of the operating member 14; thus, the operating member 14 is firmly secured on the first latching leg 124 of the latching member 12.

Figure 5:
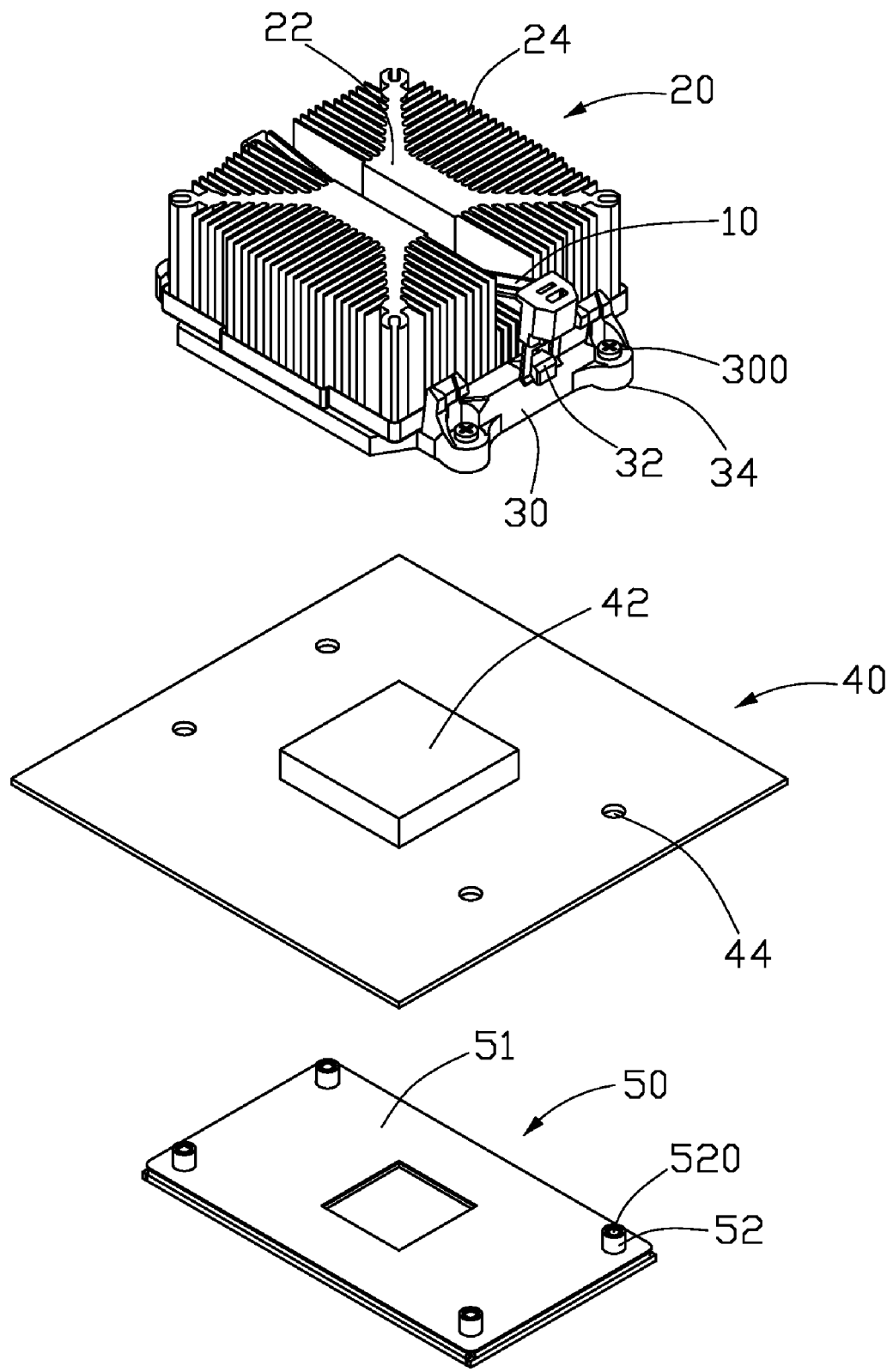
FIG. 5 is a partially assembled view of FIG. 2.

Also referring to FIG. 5, in assembly of the heat sink 20 to the retention module 30 the heat sink 20 is accommodated in the frame of the retention module 30 snugly and supported on the supporting plate 31 with the bottom surface of the spreader 22 exposed to the opening 310 of supporting plate 31. The fastener 10 is disposed on the slot 26 of the heat sink 20 between the juts 32 of the retention module 30 with the bottommost pressing portion of the pressing part 122 of the latching member 12 rests on the bottom of the slot 26. The first latching leg 124 and the second latching leg 126 are located at two sides of the heat sink 20. The second fixing hole 1260 of the second latching leg 126 receiving the corresponding jut 32 of the retention module 30. The operating member 14 is then pushed down to make the pressing part 122 of the latching member 12 deform toward the heat sink 20 and drive the first fixing hole 1240 of the first latching leg 124 move downwards to securely receive the jut 32; the heat sink 20 is thus assembled to the retention module 30

Figure 6:
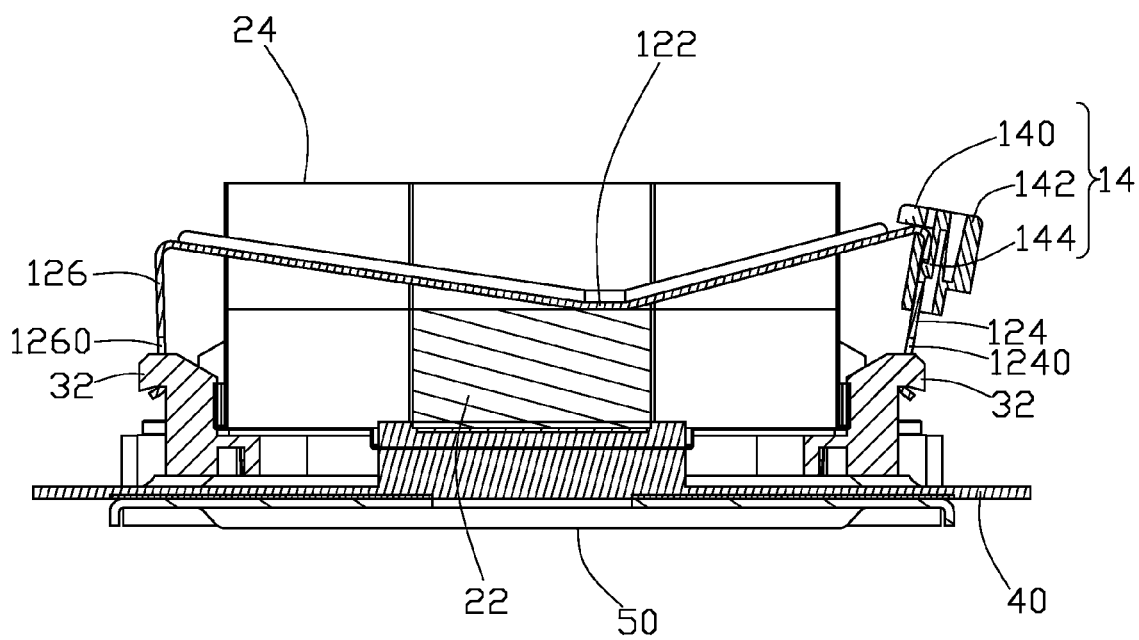
FIG. 6 is a cross-sectional view of FIG. 1 from a different aspect.

Referring also to FIG. 6, in assembly of heat sink 20 to the heat-generating component 42, the retention module 30 with the heat sink 20 rests on the printed circuit board 40 with the heat-generating component 42 received in the opening 310 of the supporting plate 31 of the retention module 30. The bottom face of the spreader 22 of the heat sink 20 rests on the top face of the heat-generating component 42. The screws 300 extend through corresponding protrusions 34 of the retention module 30 and corresponding through holes 44 of the printed circuit board 40, and are then screwed downwards to engage with the posts 52 of back plate 50. During this screwing process, the retention module 30 moves toward the printed circuit board 40, the heat sink 20 is driven downwards and presses the heat-generating component 42, the heat-generating component 42 gives a reacting force to the heat sink 20, and the fastener 10 pressed on the heat sink 20 is lifted upwards relative to the retention module 30; as a result the fixing holes 1240, 1260 of the fastener 10 are more tightly engaged with the juts 32 of the retention module 30, and the heat sink 20 is thus perfectly mounted on the printed circuit board 40 and is in intimate contact with the heat-generating component 42.

It is believed that the present embodiments and their advantages will be understood from the foregoing description, and it will be apparent that various changes may be made thereto without departing from the spirit and scope of the invention or sacrificing all of its material advantages, the examples hereinbefore described merely being preferred or exemplary embodiments of the invention.

What is claimed is:

1. A heat sink fastening assembly comprising:
a latching member having a pressing part, a first latching leg and a second latching leg bent downwards respectively from two opposite ends of the pressing part; and
an operating member having a coping and a sidewall extending downwards from an edge of the coping, the sidewall defining two locking slots engaging with the first latching leg and an elastic rib extending downwards from the coping and engaged with the first latching leg of the latching member for inhibiting any movement of the operating member in a direction along the locking slots of the sidewall.

2. The heat sink fastening assembly as claimed in claim 1, wherein the elastic rib of the operating member forms a catch at an end thereof, the first latching leg of the latching member defines a locking orifice receiving the catch of the elastic rib therein.

3. The heat sink fastening assembly as claimed in claim 2, wherein the two locking slots are respectively located in two opposite inner sides of the sidewall of the operating member.

4. The heat sink fastening assembly as claimed in claim 3, wherein the first latching leg of the latching member has two engaging sections at two lateral sides of an upper portion thereof engagingly received in the locking slots of the operating member, the locking orifice of the first latching leg being located between the engaging sections.

5. The heat sink fastening assembly as claimed in claim 4, wherein the first latching leg of the latching member has a lower portion expanding outwardly beyond the engaging sections thereof.

6. The heat sink fastening assembly as claimed in claim 5, wherein the lower portion of the first latching leg of the latching member defines a fixing hole beneath the locking orifice of the upper portion of the first latching leg, the second latching leg of the latching member defining a fixing hole corresponding to the fixing hole of the first latching leg.

7. The heat sink fastening assembly as claimed in claim 1, wherein the operating member is formed from an elastic material.

8. The heat sink fastening assembly as claimed in claim 1, wherein the coping defines two parallel recesses at a top thereof.

9. The heat sink fastening assembly as claimed in claim 1 further comprising a retention module, wherein the retention module extends two juts outwards from two opposite sides thereof for engagingly received in the two fixing holes defined in the first latching leg and the second latching legs of the latching member, respectively.

10. The heat sink fastening assembly as claimed in claim 9 further comprising a back plate corresponding to the retention module.

11. The heat sink fastening assembly as claimed in claim 10, wherein the retention module has two protrusions extending outwards from two opposite sides thereof, a positioning hole being defined in each of the protrusions for allowing a plurality of screws extending therethrough to engage with the back plate.

12. A heat sink fastening assembly comprising:
a fastener comprising:
a latching member having a pressing part, a first latching leg and a second latching leg bent downwards respectively from two opposite ends of the pressing part;
an operating member comprising a coping, a sidewall extending downwards from an edge of the coping and engaging with the first latching leg, and an elastic rib extending downwards from the coping and being fastened to the first latching leg for inhibiting any movement of the operating member in a direction along the first latching member;
a retention module mounted on a printed circuit board, the retention module comprising a supporting plate with an opening defined in centre thereof, two juts and two protrusions extending outwards from two opposite sides; and
a back plate beneath the printed circuit board for engaging with a plurality of screws extending through the protrusions of the retention module to secure the retention module on the printed circuit board.

13. The heat sink fastening assembly as claimed in claim 12, wherein the elastic rib of the operating member defines a catch at an end thereof to engage with a locking orifice defined in the first latching leg of the latching member.

14. The heat sink fastening assembly as claimed in claim 13, wherein the sidewall of the operating member defines two locking slots in two opposite inner sides thereof, the first latching leg having an upper portion thereof engaged into the slots.

15. The heat sink fastening assembly as claimed in claim 14, wherein the upper portion of the first latching leg forms two engaging sections at two lateral sides thereof engagingly received in the locking slots of the sidewall of the operating member, the locking orifice of the first latching member is located between the engaging sections.

16. The heat sink fastening assembly as claimed in claim 12, wherein the operating member is formed from plastic material.

17. The heat sink fastening assembly as claimed in claim 11, wherein the coping of the operating member defines two parallel anti-skid recesses at a top thereof.

* * * * *